(12) United States Patent
Heinrich et al.

(10) Patent No.: US 8,177,878 B2
(45) Date of Patent: May 15, 2012

(54) BONDING MATERIAL WITH EXOTHERMICALLY REACTIVE HETEROSTRUCTURES

(75) Inventors: Alexander Heinrich, Regensburg (DE); Thorsten Scharf, Regensburg (DE); Edmund Riedl, Gebelkofen (DE); Steffan Jordan, Viehhausen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/627,825

(22) Filed: Nov. 30, 2009

(65) Prior Publication Data

US 2011/0127314 A1    Jun. 2, 2011

(51) Int. Cl.
*B22F 1/00*    (2006.01)
(52) U.S. Cl. .............. 75/252; 228/122.1; 228/123.1; 252/500; 252/512; 252/514
(58) Field of Classification Search ............... 75/252; 228/121, 122.1, 124.5, 234.3, 244, 246, 248.5, 228/123.1; 252/500, 512, 514
See application file for complete search history.

(56) References Cited

U.S. PATENT DOCUMENTS

| | | | |
|---|---|---|---|
| 3,322,515 A * | 5/1967 | Dittrich et al. ................. 149/5 |
| 5,606,146 A | 2/1997 | Danen et al. |
| 7,361,412 B2 | 4/2008 | Wang et al. |
| 2001/0046597 A1 | 11/2001 | Weihs et al. |
| 2004/0149813 A1 * | 8/2004 | Weihs et al. ................. 228/246 |
| 2007/0231960 A1 | 10/2007 | Pavier et al. |
| 2010/0038409 A1 * | 2/2010 | Wilden et al. ................. 228/121 |

FOREIGN PATENT DOCUMENTS

| | | |
|---|---|---|
| DE | 3834147 A1 | 12/1990 |
| WO | 2005024942 A1 | 3/2005 |

* cited by examiner

*Primary Examiner* — Roy King
*Assistant Examiner* — Ngoclan Mai
(74) *Attorney, Agent, or Firm* — Dicke, Billig & Czaja, PLLC (57) ABSTRACT

A bonding material including a meltable joining material and a plurality of heterostructures distributed throughout the meltable joining material, the heterostructures comprising at least a first material and a second material capable of conducting a self-sustaining exothermic reaction upon initiation by an external energy to generate heat sufficient to melt the meltable joining material.

15 Claims, 6 Drawing Sheets

BONDING MATERIAL WITH EXOTHERMICALLY REACTIVE HETEROSTRUCTURES

BACKGROUND

Bonding together surfaces of two bodies with a joining or bonding material often includes the application of heat from an external heat source. During the bonding process, the external heat source typically heats not only the bonding material, but the bodies which are to be joined as well. Unfortunately, if the bodies are heat sensitive, they may be damaged from such heating. Also, if the bodies and bonding material have differing thermal characteristics, as is often the case, the bodies and bonding material may cool at different rates and create trapped mechanical stresses that may eventually cause failure of the resulting bond.

For example, semiconductor devices, such as semiconductor die, are often bonded to a substrate or carrier, such as a copper leadframe, for example, using an electrically conductive bonding material, such as a lead/tin solder. According to conventional bonding techniques, an external heat source, such as an oven, for example, heats the leadframe to a desired temperature (e.g. 400-degrees C.) and solder is applied to the leadframe at a location where the semiconductor die is desired to be attached. The semiconductor die is then placed on the solder and the entire assembly is heated to melt the solder and bond the semiconductor die to the leadframe. The assembly is then removed from the oven and cooled.

While such an approach effectively bonds the semiconductor die to the leadframe, the semiconductor die may potentially be damaged if too high a temperature is employed. Additionally, due to differing coefficients of thermal expansion between the semiconductor die and the leadframe, the semiconductor die and copper leadframe contract or shrink at different rates resulting in the creation of trapped stresses within the silicon of the semiconductor die, which can lead to failure of the bond and/or semiconductor die.

For these and other reasons there is a need for the embodiments according to the present disclosure.

SUMMARY

One embodiment provides a bonding material including a meltable joining material and a plurality of heterostructures distributed throughout the meltable joining material, the heterostructures comprising at least a first material and a second material capable of conducting a self-sustaining exothermic reaction upon initiation by an external energy to generate heat sufficient to melt the meltable joining material. According to one embodiment, the meltable joining material comprises an electrically conductive material.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." Also, the term "exemplary" is merely meant as an example, rather than the best or optimal. The following detailed description, therefore, is not to be taken in a limiting sense, and the scope of the present invention is defined by the appended claims.

The embodiments of a method of fabricating a semiconductor device may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general the term "semiconductor chip" as used in this application can have different meanings one of which is a semiconductor die or semiconductor substrate including an electrical circuit.

In several embodiments layers are applied to one another or materials are applied or deposited onto layers. It should be appreciated that any such terms as "applied" or "deposited" are meant to cover literally all kinds and techniques of applying layers onto each other. In one embodiment, they are meant to cover techniques in which layers are applied at once as a whole, in for example, laminating techniques; as well as techniques in which layers are deposited in a sequential manner, in for example, sputtering, plating, molding, chemical vapor deposition (CVD) techniques. One example for a layer to be applied is a redistribution layer (RDL) patterned in electrical connection with contacts of a chip. The redistribution layer can be in the form of a multilayer, in particular a multilayer including a repeating layer sequence.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, e.g., solder alloy, or an electrically conducting organic material, or an electrically conducting semiconductor material.

In some embodiments the semiconductor chips are covered with an encapsulant material. The encapsulant material includes any electrically insulating material like, for example, any kind of molding material, any kind of epoxy material, or any kind of resin material with or without any kind of filler materials. In special cases it could be advantageous to use a conductive encapsulant material. In the process of covering the semiconductor chips or dies with the encapsulant material, a fan-out of embedded dies is fabricated. The fan-out of embedded dies is arranged in an array having the form of a wafer and is referred to as a "re-configured wafer." However, it should be appreciated that the fan-out of embedded dies is not limited to the form and shape of a wafer but can have any size and shape and any suitable array of semiconductor chips embedded therein.

In the claims and in the following description different embodiments of a method of fabricating a semiconductor device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

Embodiments described herein provide a bonding material including exothermically reactive heterostructures, and a low heat method of bonding two surfaces using the bonding material according to embodiments described herein. According to one embodiment, which will be described in greater detail herein, the bonding material includes a plurality of nanoscale particles of at least two exothermically reactive materials mixed throughout a meltable joining material (e.g. an electrically conductive joining material), such that when ignited by an external energy source, the nanoscale particles undergo a self-sustaining exothermic reaction which generates heat sufficient to melt the meltable joining material to thereby bond together a pair of selected surfaces.

Figure 1:
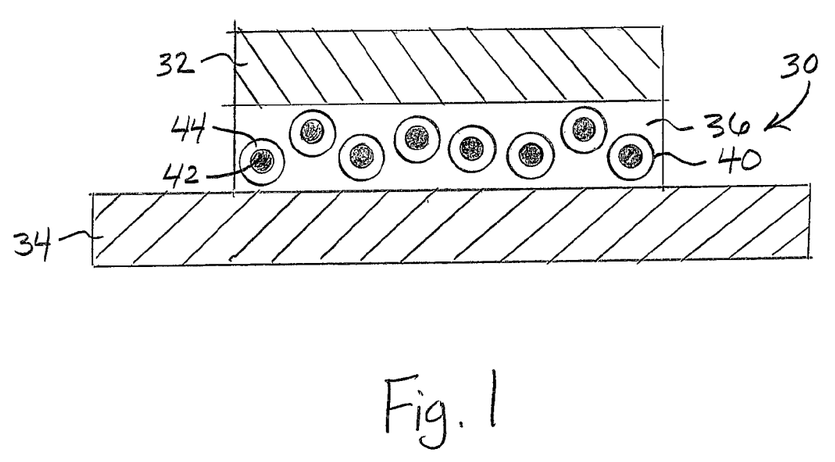
FIG. 1 is a diagram illustrating a joining material according to one embodiment of the present disclosure.

FIG. 1 is a diagram illustrating a reactive bonding material 30 for joining or bonding first and second bodies 32 and 34, according to one embodiment of the present disclosure.

According to one embodiment, bonding material 30 includes a meltable joining material 36 and a plurality of heterostructures 40 distributed throughout meltable joining material 36. According to one embodiment, meltable joining material 36 comprises an electrically conductive joining material 36. According to one embodiment, electrically conductive joining material 36 comprises a fusible metal alloy. According to one embodiment, electrically conductive joining material 36 comprises a solder. According to one embodiment, electrically conductive joining material 36 comprises a soft solder (e.g. lead/tin or lead-free solder). According to one embodiment, electrically conductive joining material 36 comprises a hard solder (e.g. copper/zinc or copper/silver alloy). According to one embodiment, meltable joining material 36 comprises a thermally conductive joining material, which may or may not be electrically conductive.

According to one embodiment, heterostructures 40 comprise at least a first material 42 and a second material 44, each of which are different from electrically conductive joining material 36 and which together are capable, upon initiation by an external energy, of conducting a self-sustaining exothermic reaction which generates heat sufficient to melt electrically conductive joining material 36. According to one embodiment, electrically conductive material comprises a lead/tin solder.

As defined herein, a heterostructure is a structure comprising at least two different materials or phases forming a boundary therebetween, wherein the at least two different materials are capable of maintaining a self-sustaining exothermic reaction. According to one embodiment, the heterostructures are defined as having a maximum dimension (e.g. a diameter) not exceeding 500 µm. According to one embodiment, the heterostructures comprise nanoparticles defined as having a maximum dimension (e.g. a diameter) less than 1000 nm. According to one embodiment, as illustrated by FIG. 1, heterostructures 40 comprise nanoparticles having a core and shell configuration, wherein first material 42 forms the core, and second material 44 forms the surrounding shell. According to one embodiment, heterostructures 40 comprise nanowires comprising a wire of first material 42 coated with second material 44. Examples of materials and structures suitable for use as heterostructures 40 are described in greater detail below.

Figure 2:
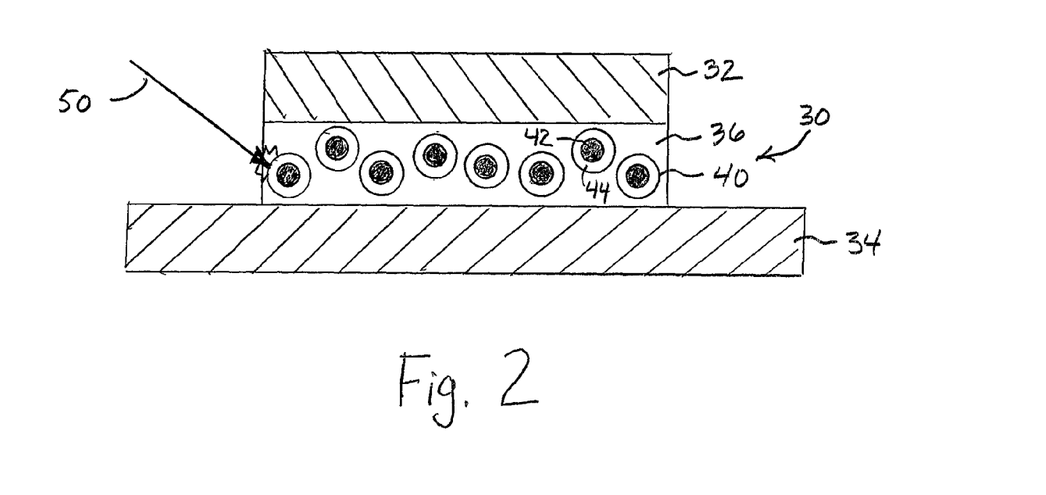
FIG. 2 illustrates a portion of a process of bonding two surfaces employing a joining material according to the present disclosure.

FIGS. 2-5 illustrate a method of joining or bonding two bodies employing reactive joining material 30 according to one embodiment of the present disclosure. With reference to FIG. 2, joining material 30 is disposed between the surfaces of first and second bodies 32 and 34 which are desired to be bonded to one another. According to one embodiment, reactive joining material 30 comprises a preformed shape which is first attached to either first body 32 or second body 34, such as by use of an adhesive, or simply by stacking, for example. According to one embodiment, first body 32 comprises a semiconductor chip and second body 34 comprises an electrically conductive chip carrier, such as a copper leadframe, for example. However, first and second bodies 32 and 34 can comprise any bodies which may be bonded via thermally or electrically conductive joining material 36.

As further illustrated by FIG. 2, an external stimulus or activation energy 50 is applied to joining material to initiate an exothermic reaction between first and second materials 42 and 44. According to one embodiment, external activation energy 50 is a laser. Other suitable activation energies may also be employed, such as microwaves, electric spark discharge, flames, a hot contact, and induction (e.g. using frequencies based on first and second materials 42, 44), for example.

Figure 3:
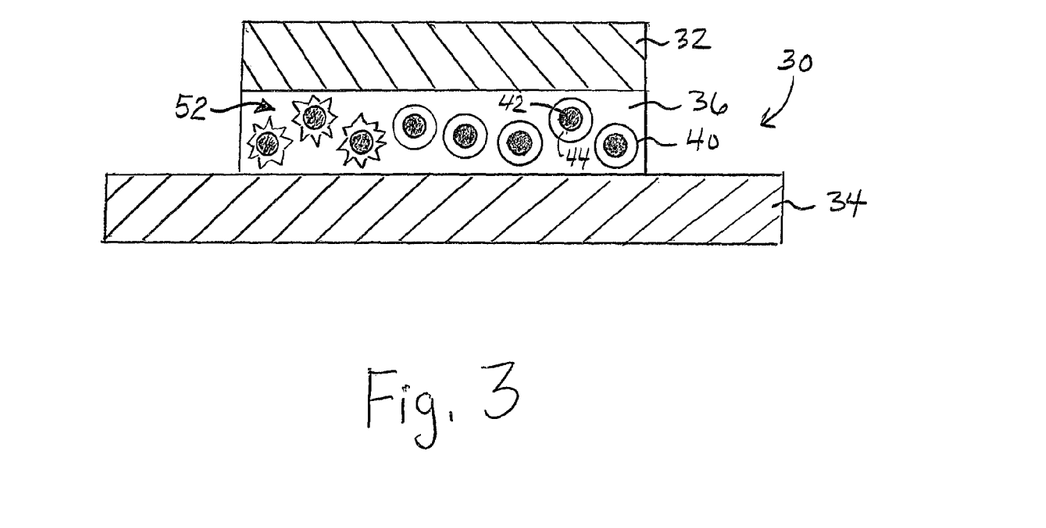
FIG. 3 illustrates a portion of a process of bonding two surfaces employing a joining material according to the present disclosure.

With reference to FIG. 3, upon initiation, the exothermic reaction begins to propagate from one heterostructure 40 to adjacent heterostructures 40, as illustrated at 52. As described below, a concentration of heterostructures 40 within electrically conductive joining material 36 is selected so that heat generated by the exothermic reaction is sufficient to initiate the exothermic reaction of adjacent heterostructures 40 and initiate a self-sustaining exothermic reaction of heterostructures 40 throughout bonding material 30.

Figure 4:
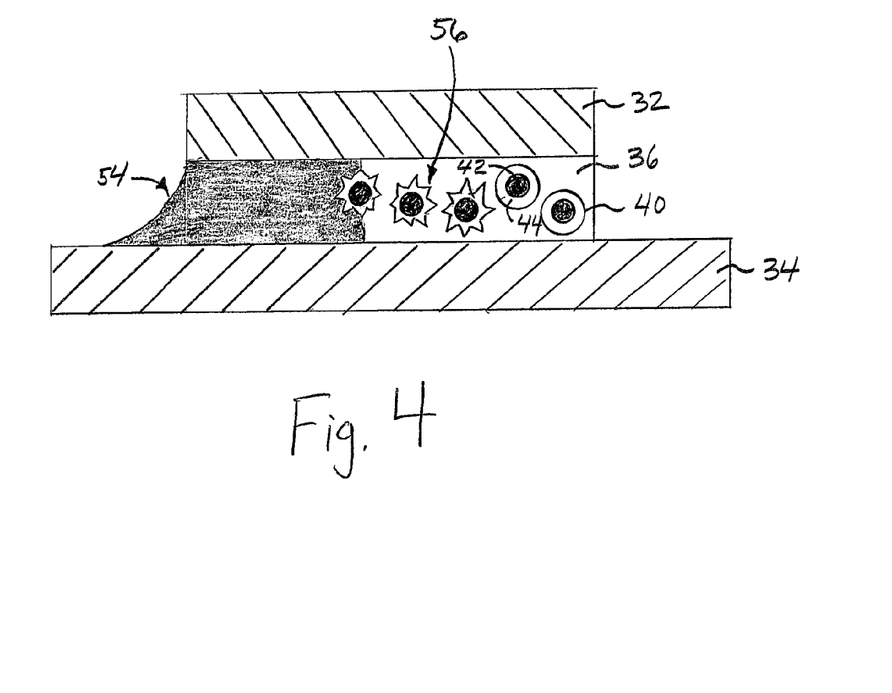
FIG. 4 illustrates a portion of a process of bonding two surfaces employing a joining material according to the present disclosure.
Figure 5:
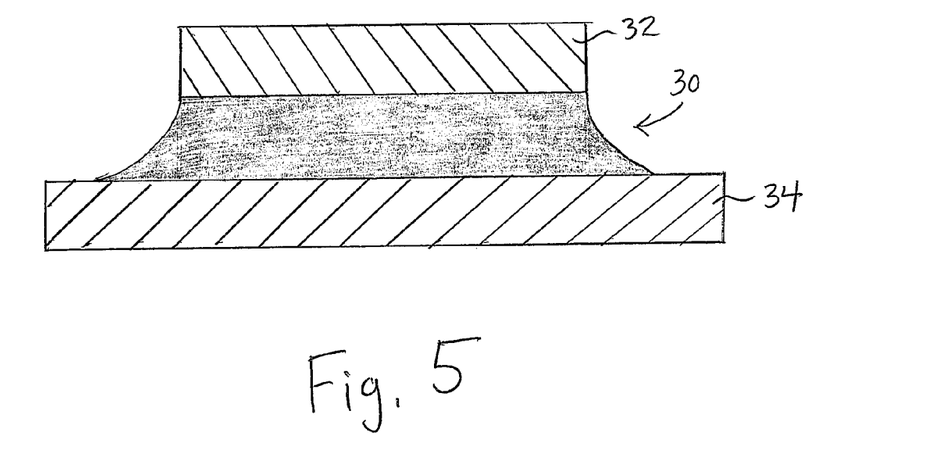
FIG. 5 illustrates a portion of a process of bonding two surfaces employing a joining material according to the present disclosure.

With reference to FIG. 4, as the exothermic reaction propagates through bonding material 30, heat generated from the chemical reaction between first and second materials 42 and 44 in areas where the exothermic reaction is complete or substantially complete melts electrically conductive joining material 36, as illustrated at 54. In other areas, as illustrated at 56, the exothermic reaction continues to propagate through unreacted portions of heterostructures 40 of bonding material 30. Eventually, as illustrated by FIG. 5, the exothermic reaction continues until all, or substantially all, heterostructures 40 have reacted with one another and have melted the entire volume of bonding material 30. Bonding material 30 is then cooled to form a hardened, electrically conductive bond between first and second bodies 32 and 34.

Employing exothermically reactive heterostructures 40 to melt electrically conductive joining material 36, according to embodiments described herein, substantially restricts heating to bonding material 30 so that heating of bodies 32 and 34 is greatly limited as compared to conventional techniques. By restricting heating primarily to bonding material 30, the creation of trapped mechanical stresses during cool down resulting from differing coefficients of thermal expansion between bodies 32, 34 and bonding material 30 (as earlier described) is substantially reduced and/or eliminated, as is potential damage to bodies 32, 34 resulting from overheating.

Figure 6:
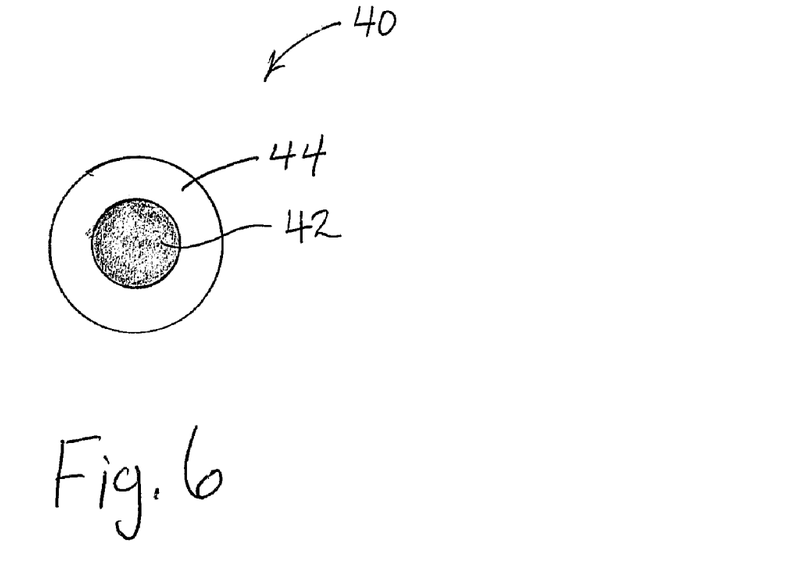
FIG. 6 illustrates one embodiment of a heterostructure suitable for use in a joining material according to the present disclosure.

According to one embodiment, as illustrated by FIG. 6, and as described above, heterostructures 40 comprise a generally spherical core-shell nanoparticle with first material 42 forming a core and second material 44 forming an encasing shell. First and second materials 42 and 44 may comprise any suitable combination of materials which, upon application of an activation energy, such as activation energy 50, exothermically react and release heat.

According to one embodiment, first and second materials 42 and 44 together form what is typically referred to as a thermite composition. In general, thermite is a composition of a metal, sometimes referred to as "fuels", and a metal oxide, sometimes referred to as "oxidizers", which produce an exothermic reaction often referred to as a "thermite reaction." According to one embodiment, first material 42 comprises the so-called "oxidizer", while second material 44 comprises the so-called "fuel." In one embodiment, first material 42 comprises iron oxide ($Fe_2O_3$) and second material 44 comprises aluminum (Al) which, upon application of an activation energy undergoes an exothermic reaction described as follows:

$$Fe_2O_3 + 2Al \rightarrow 2Fe + Al_2O_3 + Heat.$$

In general, a thermite composition employing aluminum as the so-called fuel undergoes what is commonly referred to as an "alumithermic reaction." In addition to iron oxide, as described above, aluminum can be employed as the fuel with any suitable oxidizer including, for example, silicon (IV) oxide, chromium (III) oxide, manganese (IV) oxide, copper (II) oxide. Explicitly, such alumithermic reactions can be described by the following equations:

$$3SiO_2 + 2Al \rightarrow 3Si + Al_2O_3 + Heat;$$

$$Cr_2O_3 + 2Al \rightarrow 2Cr + Al_2O_3 + Heat;$$

$$3MnO_2 + 2Al \rightarrow 3Mn + Al_2O_3 + Heat; \text{ and}$$

$$3CuO + 2Al \rightarrow 3Cu + Al_2O_3 + Heat.$$

Other suitable materials may be employed for the fuel as well, including, for example, magnesium, calcium, titanium, zinc, silicon, and boron. Compositions employing calcium as the fuel undergo what is generally referred to as a "calciothermic reaction" (such as with $TiF_4$, for example), while those employing carbon undergo a "carbothermic reaction", and those employing silicon under a "silicothermic reaction" (such as with Rh, Ni, or Zr, for example).

Examples of other suitable compositions include zinc and sulfur, barium oxide and magnesium, and copper oxide and iron, which can be respectively described as follows:

$$Zn + S \rightarrow ZnS + Heat;$$

$$BaO_2 + Mg \rightarrow BaO + MgO + Heat; \text{ and}$$

$$3CuO + 2Fe \rightarrow 3Cu + Fe_2O_3 + Heat.$$

Combinations of pure metals may also be employed such as Ni/Al, Ti/Al, and Zr/Al, for example.

As can be seen from the above discussion, any number of suitable combinations may be employed for first and second materials 42, 44, so long as the combination is capable of conducting an exothermic reaction.

According to one embodiment, as mentioned above, a concentration of heterostructures 40 within electrically conductive joining material 36 is selected so that heat generated by the exothermic reaction is sufficient to initiate the exothermic reaction of adjacent heterostructures 40 and initiate a self-sustaining exothermic reaction of heterostructures 40 throughout bonding material 30. Additionally, the concentration is selected such that the heat generated by the exothermic reaction is sufficient to melt the entire volume of electrically conductive joining material 36, but not to overheat electrically conductive joining material 36 such that undesirable amounts of heat are transferred to first and second bodies 32, 34.

The amount of heat generated by an exothermic reaction depends on the particular combination of compounds employed for first and second materials 42, 44. Also, the amount of heat required to melt electrically conductive joining material 36 depends on the particular material employed. As such, the concentration of heterostructures 40 within bonding material 30 will vary depending on the compounds employed for first and second materials 42, 44 and for electrically conductive joining material 36.

According to one embodiment, tin (Sn) or lead (Pb) solder was employed as electrically conductive joining material 36, and a thermite composition of iron oxide ($Fe_2O_3$) and aluminum (2Al) was employed for first and second materials 42 and 44 of core-shell nanoparticles 40. Taking into account a temperature rise and an energy required for melting solder joining material 36, a concentration of approximately 3 percent by weight of core-shell nanoparticles 40 of iron oxide ($Fe_2O_3$) and aluminum (2Al) was required for bonding material 30 in order to maintain a self-sustaining exothermic reaction which released heat sufficient to melt solder joining material 36.

Although not illustrated herein, it is noted that in some instances, a thin barrier layer of inert material may need to be deposited at the phase boundary between first and second materials 42 and 44 in order to prevent premature ignition of the exothermic reaction. Additionally, although illustrated primarily herein as comprising only two compounds (e.g. first and second materials 42 and 44), it is noted that heterostructures 40 may comprise more than two exothermically reactive compounds (e.g. three compounds).

Figure 7:
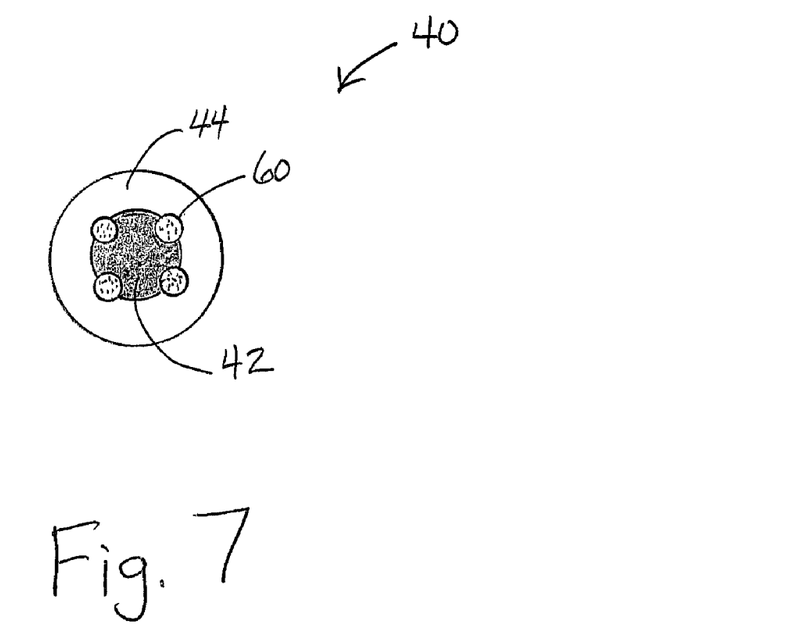
FIG. 7 illustrates one embodiment of a heterostructure suitable for use in a joining material according to the present disclosure.
Figure 8:
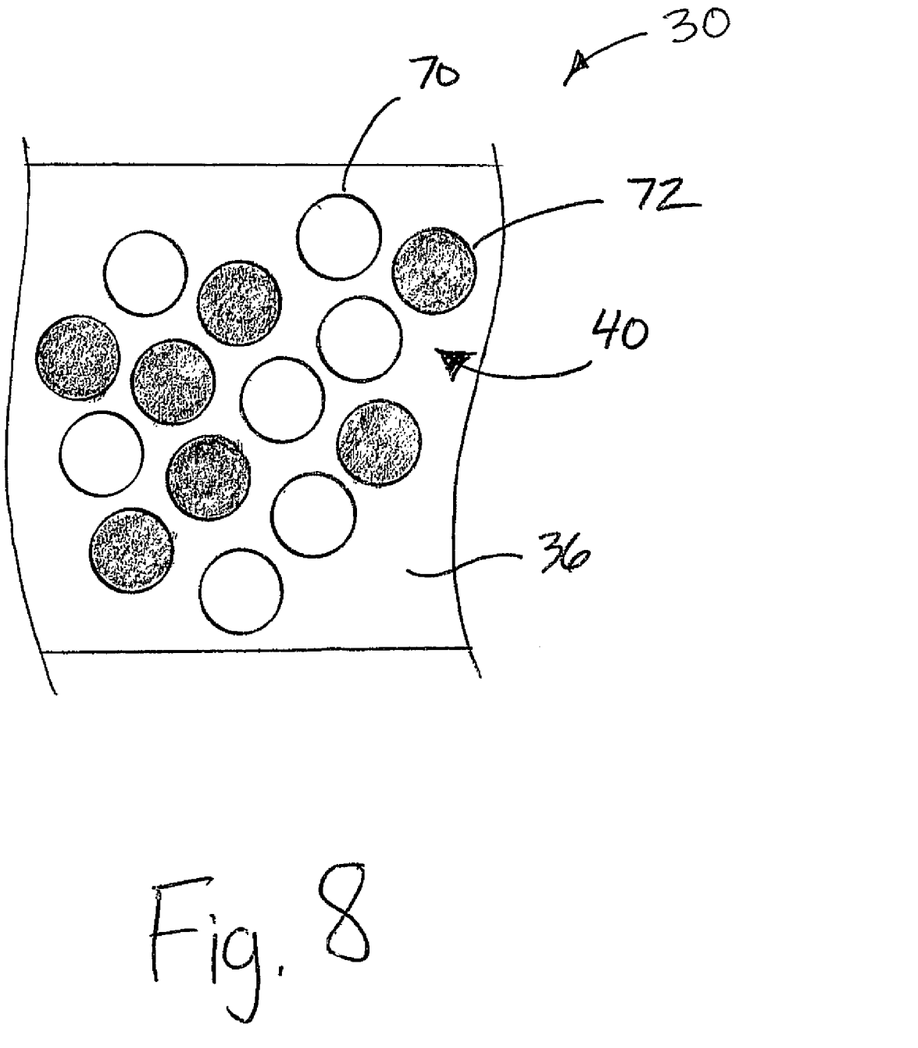
FIG. 8 illustrates one embodiment of a heterostructure suitable for use in a joining material according to the present disclosure.

Other suitable structures may be employed for heterostructures 40. For example, according to one embodiment, if core-shell nanoparticles, such as core-shell nanoparticles 40 illustrated by FIG. 6, and an induction technique is desired to be employed as activation energy 50, additional pure elements of the oxidizer compound employed for first or core material 42 may be required. For example, as illustrated by FIG. 7, based on core-shell nanoparticle 40 of FIG. 6, where iron oxide ($Fe_2O_3$) and aluminum (2Al) is employed for first and second materials 42 and 44, additional Fe domains may be necessary in order for proper initiation of the exothermic reaction using induction initiation. As illustrated by FIG. 7, according to one embodiment, additional domains 60 of elemental iron are disposed along the phase boundary between the core of iron-oxide first material 42 and the shell of aluminum of second material 44. During the induction process, bonding material 30 will be exposed to a selected frequency at which the domains 60 of elemental iron will vibrate and generate heat sufficient to initiate the exothermic reaction between the iron-oxide of first material 42 and the aluminum of second material 44, and thereby trigger the self-sustaining exothermic reaction of nanoparticles According to other embodiments, in addition to heterostructures 40 comprising nanostructures, such as nanowires (not illustrated) and core-shell structures (e.g. such as illustrated by FIGS. 6 and 7), heterostructures 40 may comprise independent, but intermixed particles of exothermically reactive compounds. For example, as illustrated by FIG. 8, heterostructures 40 comprise particles (e.g. nanoparticles) of first and second materials 70 and 72 which are intermixed with one another throughout electrically conductive joining material 36 of bonding material 30. For example, according to one embodiment, nanoparticles of first material 70 comprise iron-oxide ($Fe_2O_3$), and nanoparticles of second material 72 comprise aluminum (Al). While such an approach is feasible, proper distribution of nanoparticles of first and second materials 70 and 72 throughout electrically conductive joining material 36 as required to maintain a self-sustaining exothermic reaction may be difficult to achieve since there is no way to guarantee that the nanoparticles of $Fe_2O_3$ and those of $Al_2$ will be in close enough proximity and in proper numbers.

Figure 9:
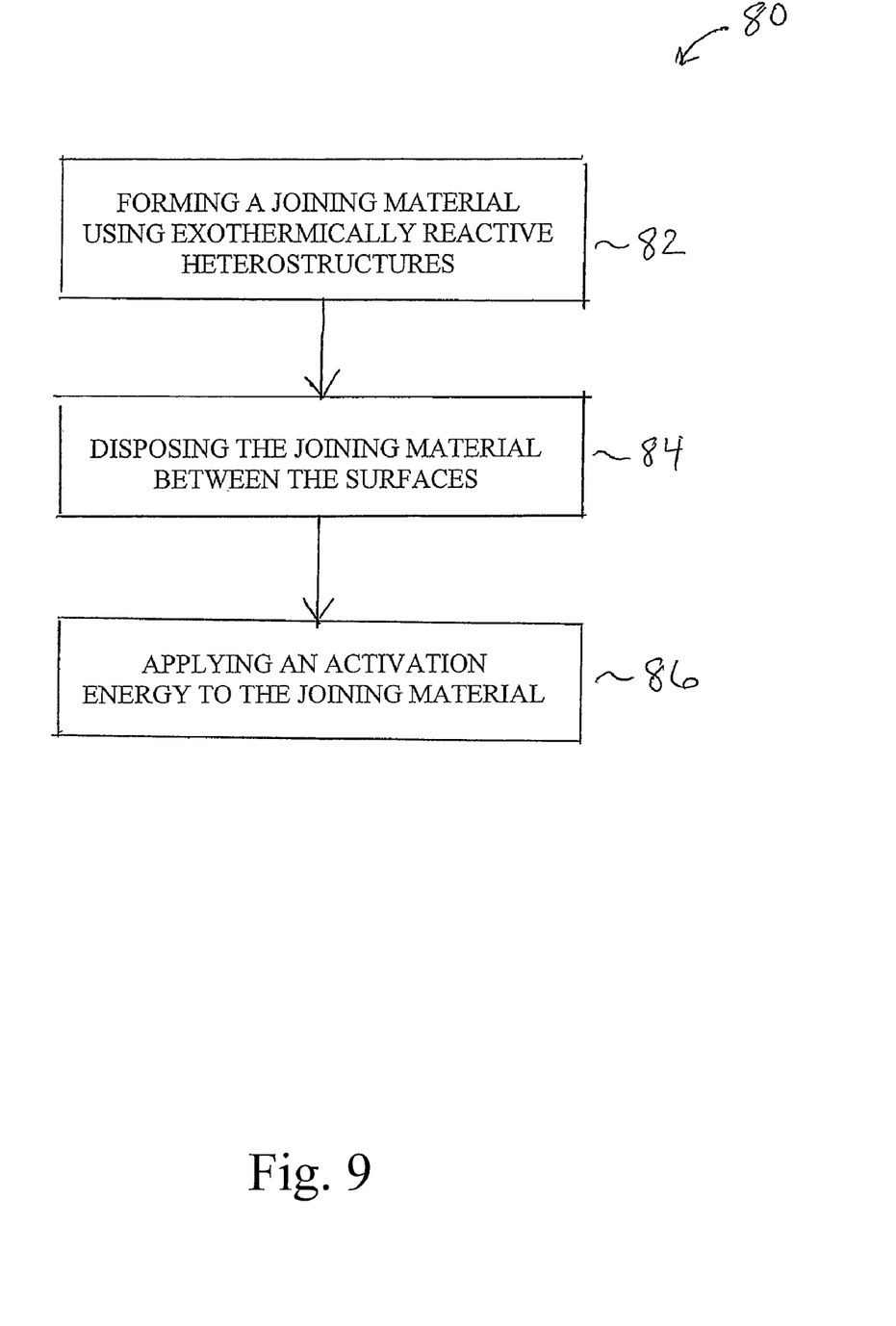
FIG. 9 is flow diagram illustrating one embodiment of a process of bonding two surfaces employing a joining material according to the present disclosure.

FIG. 9 is a flow diagram of a process 80 for attaching a first surface of a first body to a second surface of a second body. Process 80 begins at 82 wherein a joining material is formed by mixing heterostructures comprising at least a first material and a second material throughout an electrically conductive material, the first and second materials being capable of conducting a self-sustaining exothermic reaction.

At 84, the joining material is disposed between the first and second surfaces. According to one embodiment, the joining material comprises a preformed shape with is attached to at least one of the first and second surfaces, such as by gluing, for example. According to one embodiment, the first surface comprises a metal layer of a semiconductor chip, and the second surface comprises a surface of a leadframe (e.g. a copper leadframe).

At 86, an activation energy is applied to the joining material to initiate the self-sustaining exothermic reaction, wherein the exothermic reaction generates heat sufficient to melt the electrically conductive material and join the first and second surfaces. According to one embodiment, the activation energy comprises a laser pulse. According to other embodiments, the activation energy comprises and activation energy suitable to initiate the exothermic reaction such as microwaves, induction, electric spark discharge, flames, and a hot contact, for example.

As described above, one benefit of employing reactive bonding material 30 according to embodiments of the present disclosure is that heating is restricted primarily to bonding material 30, thereby reducing and/or eliminating the creation of trapped mechanical stresses during cool down resulting from differing coefficients of thermal expansion between bodies 32, 34 and bonding material 30. Limiting the heat to reactive bonding material 30 may also prevent damage to bodies 32, 34 being joined. For example, when soldering a heat sink to a semiconductor device, such as a microprocessor, for example, heating the heat sink to the required soldering temperature would destroy the microprocessor before the heat sink could cool down.

Other benefits are possible as well. For example, according to one embodiment, reactive bonding material 30 can be employed to form so-called "self-soldering" devices. According to such an embodiment, reactive bonding material 30 is preformed into desired shapes which are applied to a surface of a device, such as by gluing, for example. In an alternate embodiment, reactive bonding material 30 is applied to the surface of the device in the form of a paste. The device is then placed on a desired surface and soldered thereto simply by application of an external energy, such as a laser for example. Such self-soldering devices are ideally suited for so-called second level soldering in electronics applications, where thermal loading of device components is of great concern. Devices provided with attached bonding material 30 could also be soldered by domestic users simply by initiating the exothermic reaction with an energy source, such as a hot tip of a soldering iron or a spark discharge, for example.

Additionally, reactive bonding material 30, according to the present disclosure, enables the soldering of devices or pieces which would otherwise be difficult to access, such as the surfaces of large devices, for example. Also, by using preformed shapes, for example, reactive bonding material 30 enables soldering to be performed "around corners", so long as the reactive bonding material 30 is continuous. Bonding material 30, therefore, enables bonding (e.g. soldering) in an otherwise inaccessible geometry, especially when activated by use of non-contact energy sources, such as microwaves, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A bonding material for attaching a semiconductor device to a surface, the bonding material comprising
   a meltable joining material; and
   a plurality of heterostructures distributed throughout the meltable joining material, the heterostructures comprising at least a first material and a second material capable of conducting a self-sustaining exothermic reaction upon initiation by an external energy to generate heat sufficient to melt the meltable material and which subsequently hardens to attach the semiconductor device to the surface, wherein the heterostructures comprise one of core-shell nanoparticles comprising a particle of the first material coated with the second material and micro- or nano-wires comprising a core of the first material coated with the second material.

2. The bonding material of claim 1, wherein the first and second materials form a thermite composition.

3. The bonding material of claim 2, wherein the first material comprises one selected from a group consisting of boron oxide, silicon oxide, chromium oxide, iron oxide, copper oxide, and lead oxide, and second material comprises one selected from a group consisting of aluminum, magnesium, calcium, titanium, zinc, silicon, and boron.

4. The bonding material of claim 1, wherein the meltable joining material comprises an electrically conductive material.

5. The bonding material of claim 4, wherein the electrically conductive material comprises one of a hard solder and a soft solder.

6. The bonding material of claim 1, wherein the meltable joining material comprises a thermally conductive material.

7. The bonding material of claim 1, wherein the heterostructures have a concentration by weight of the bonding material selected such that heat generated by the exothermic reaction is sufficient to initiate and maintain the exothermic reaction and to melt substantially an entire mass of electrically conductive material without transferring an undesirable amount of thermal energy to surfaces being bonded with the bonding material.

8. The bonding material of claim 1, wherein the heterostructures have a concentration at least 3% by weight of the bonding material.

9. The bonding material of claim 1, wherein the heterostructures have a diameter not exceeding five hundred micrometers.

10. A reactive bonding material for attaching a semiconductor device to a surface, the reactive bonding material comprising:
a fusible metal alloy; and
a plurality of nanoparticles mixed within and distributed throughout the fusible metal alloy, the nanoparticles comprising a core of a first material coated by a shell of a second material, the first and second materials being selected so as to be capable of conducting a self-sustaining exothermic reaction to melt the fusible metal alloy which subsequently hardens to bond the semiconductor device to the surface.

11. The bonding material of claim 10, wherein the first and second materials form a thermite composition.

12. The bonding material of claim 11, wherein the first material comprises one selected from a group consisting of boron oxide, silicon oxide, chromium oxide, iron oxide, copper oxide, and lead oxide, and second material comprises one selected from a group consisting of aluminum, magnesium, calcium, titanium, zinc, silicon, and boron.

13. The bonding material of claim 10, wherein the fusible metal alloy comprises solder.

14. The reactive bonding material of claim 10, wherein a plurality of domains of the first material are disposed along a phase boundary between the core and the shell.

15. The reactive bonding material of claim 10, wherein a layer of inert material is deposited on the core so as to provide a barrier layer between the first material of the core and the second material of the shell.

* * * * *

UNITED STATES PATENT AND TRADEMARK OFFICE
CERTIFICATE OF CORRECTION

PATENT NO. : 8,177,878 B2  
APPLICATION NO. : 12/627825  
DATED : May 15, 2012  
INVENTOR(S) : Alexander Heinrich et al.

Page 1 of 1

It is certified that error appears in the above-identified patent and that said Letters Patent is hereby corrected as shown below:

Title page, (75) Inventors section, delete "Steffan Jordan" and insert in place thereof --Steffen Jordan--.

Signed and Sealed this
Twenty-third Day of April, 2013

Teresa Stanek Rea
*Acting Director of the United States Patent and Trademark Office*